United States Patent
Ebrish et al.

(10) Patent No.: US 9,799,736 B1
(45) Date of Patent: Oct. 24, 2017

(54) HIGH ACCEPTOR LEVEL DOPING IN SILICON GERMANIUM

(71) Applicant: International Business Machines Corporation, Armonk, NY (US)

(72) Inventors: Mona Abdulkhaleg Ebrish, Albany, NY (US); Oleg Gluschenkov, Tannersville, NY (US); Shogo Mochizuki, Clifton Park, NY (US); Alexander Reznicek, Troy, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/215,297

(22) Filed: Jul. 20, 2016

(51) Int. Cl.
| | |
|---|---|
| H01L 21/336 | (2006.01) |
| H01L 29/167 | (2006.01) |
| H01L 21/02 | (2006.01) |
| H01L 29/78 | (2006.01) |
| H01L 29/08 | (2006.01) |
| H01L 21/225 | (2006.01) |
| H01L 29/165 | (2006.01) |

(52) U.S. Cl.
CPC ...... *H01L 29/167* (2013.01); *H01L 21/02381* (2013.01); *H01L 21/02532* (2013.01); *H01L 21/2254* (2013.01); *H01L 29/0847* (2013.01); *H01L 29/165* (2013.01); *H01L 29/785* (2013.01)

(58) Field of Classification Search
CPC .................................................. H01L 21/845
USPC ......................................................... 438/284
See application file for complete search history.

(56) References Cited

U.S. PATENT DOCUMENTS

| | | | |
|---|---|---|---|
| 6,417,058 B1 | 7/2002 | Richardson et al. | |
| 7,033,921 B2 | 4/2006 | Jurgensen | |
| 7,859,030 B2 | 12/2010 | Aoki | |
| 8,759,200 B2 | 6/2014 | Francis et al. | |
| 8,853,008 B1 | 10/2014 | Lee | |
| 9,054,193 B2 * | 6/2015 | Yin ..................... | H01L 29/0684 |
| 9,059,024 B2 * | 6/2015 | Glass .............. | H01L 21/823821 |
| 2015/0287810 A1 | 10/2015 | Kerber et al. | |
| 2016/0071956 A1 | 3/2016 | Balakrishnan et al. | |

FOREIGN PATENT DOCUMENTS

| | | |
|---|---|---|
| CN | 104681439 A | 6/2015 |
| GB | 1442930 | 7/1976 |

OTHER PUBLICATIONS

Felix Edelman et al., "Structure and Transport Properties of Ga-Doped Semi- and Polycrystalline Si1-xGex Films," 15th Int'l Conference on Thermoelectrics, 1996, pp. 474-478.

* cited by examiner

*Primary Examiner* — Chandra Chaudhari
(74) *Attorney, Agent, or Firm* — Daniel P. Morris, Esq.; Otterstedt, Ellenbogen & Kammer, LLP

(57) ABSTRACT

A gallium-doped sacrificial epitaxial or polycrystalline germanium layer is formed on a silicon germanium substrate having a high percentage of germanium followed by annealing to diffuse the gallium into the silicon germanium substrate. The germanium layer is selectively removed to expose the surface of a gallium-doped silicon germanium region within the silicon germanium substrate. The process has application to the formation of electrically conductive regions within integrated circuits such as source/drain regions and junctions without the introduction of carbon into such regions.

12 Claims, 3 Drawing Sheets

HIGH PERCENTAGE SiGe SURFACE

HIGH PERCENTAGE SiGe SURFACE

/////////// SiGe: Ga ///////////

HIGH PERCENTAGE SiGe SURFACE

/////////// SiGe: Ga ///////////

HIGH PERCENTAGE SiGe SURFACE

FIG. 5   20   24

HIGH ACCEPTOR LEVEL DOPING IN SILICON GERMANIUM

BACKGROUND

The present disclosure relates to the electrical, electronic, and computer arts, and, more particularly, to methods for providing high gallium doping in high-Ge percentage silicon germanium substrates without carbon incorporation, and structures obtained by such methods.

High doping levels are desirable in various elements of electronic semiconductor devices such as FinFET devices. Silicon germanium is often preferred to silicon within such devices to facilitate the performance thereof. Silicon germanium having germanium content of at least eighty-five percent (85%) has a band structure close to pure germanium. Channel materials including high germanium content offer potential for developing 7 nm and later nodes.

Source/drain regions, contact regions and some other elements found in semiconductor devices used to form integrated circuits are doped with n-type and/or p-type dopants. Boron-doped silicon germanium source/drain regions can, for example, be employed within pFETs. The solid solubility of boron in high percentage silicon germanium alloys ($Si_{1-x}Ge_x$ where x is 0.85 or greater) is, however, low. Gallium is a p-type dopant with higher solubility in high percentage silicon germanium than boron. Due to the tight architecture of some device structures, gallium implantation is not always a viable option. In situ doped epitaxial processes using metal-organic gallium precursors lead to carbon incorporation, which is undesirable as it increases resistance.

SUMMARY

Embodiments of the present disclosure provide a means for obtaining effective doping of high percentage silicon gallium alloys without carbon incorporation in the resulting structure.

A method for providing gallium doping in a silicon germanium layer includes obtaining a substrate including a silicon germanium alloy surface layer having the composition $Si_{1-x}Ge_x$ where x is 0.85 or greater, forming a gallium-doped germanium layer on the silicon germanium alloy surface layer, the germanium layer having a higher germanium content and a lower melting point than the silicon germanium alloy surface layer, causing diffusion of gallium from the germanium layer into the silicon germanium alloy surface layer, thereby forming a gallium-doped silicon germanium region within the silicon germanium alloy surface layer, and removing the germanium layer from the silicon germanium alloy surface layer.

A semiconductor structure includes a substrate including a silicon germanium alloy surface layer having the composition $Si_{1-x}Ge_x$ where x is 0.85 or greater and a gallium-doped silicon germanium region within the silicon germanium alloy surface layer. The gallium-doped silicon germanium region has a dopant profile comprising a diffusion profile and includes no dopant-induced end-of-range crystal defects.

Additional aspects of the disclosure are directed to a structure formed at least in part using a method like that set forth in the previous paragraph.

BRIEF DESCRIPTION OF THE DRAWINGS

These and other features, aspects, and advantages of the present invention will become better understood with regard to the following description, appended claims, and accompanying drawings where:

FIG. 2 shows a sectional view of a high percentage silicon germanium alloy surface layer;

FIG. 3 shows a sectional view of the surface layer of FIG. 2 including a gallium-doped germanium layer grown thereon in performing the FIG. 1 method;

FIG. 4 shows a sectional view of the film stack shown in FIG. 3 following annealing that causes diffusion of gallium into the silicon germanium surface layer;

FIG. 5 shows a sectional view of the film stack shown in FIG. 4 following removal of the germanium layer.

In the sectional views included herein, features present in some embodiments behind the sectional planes are not shown to reduce clutter and enhance clarity.

DETAILED DESCRIPTION

The subject matter of the instant application will be described with reference to illustrative embodiments. For this reason, numerous modifications can be made to these embodiments and the results will still come within the scope of the invention. No limitations with respect to the specific embodiments described herein are intended or should be inferred.

As the term is used herein and in the appended claims, "about" means within plus or minus twenty percent.

Figure 1:
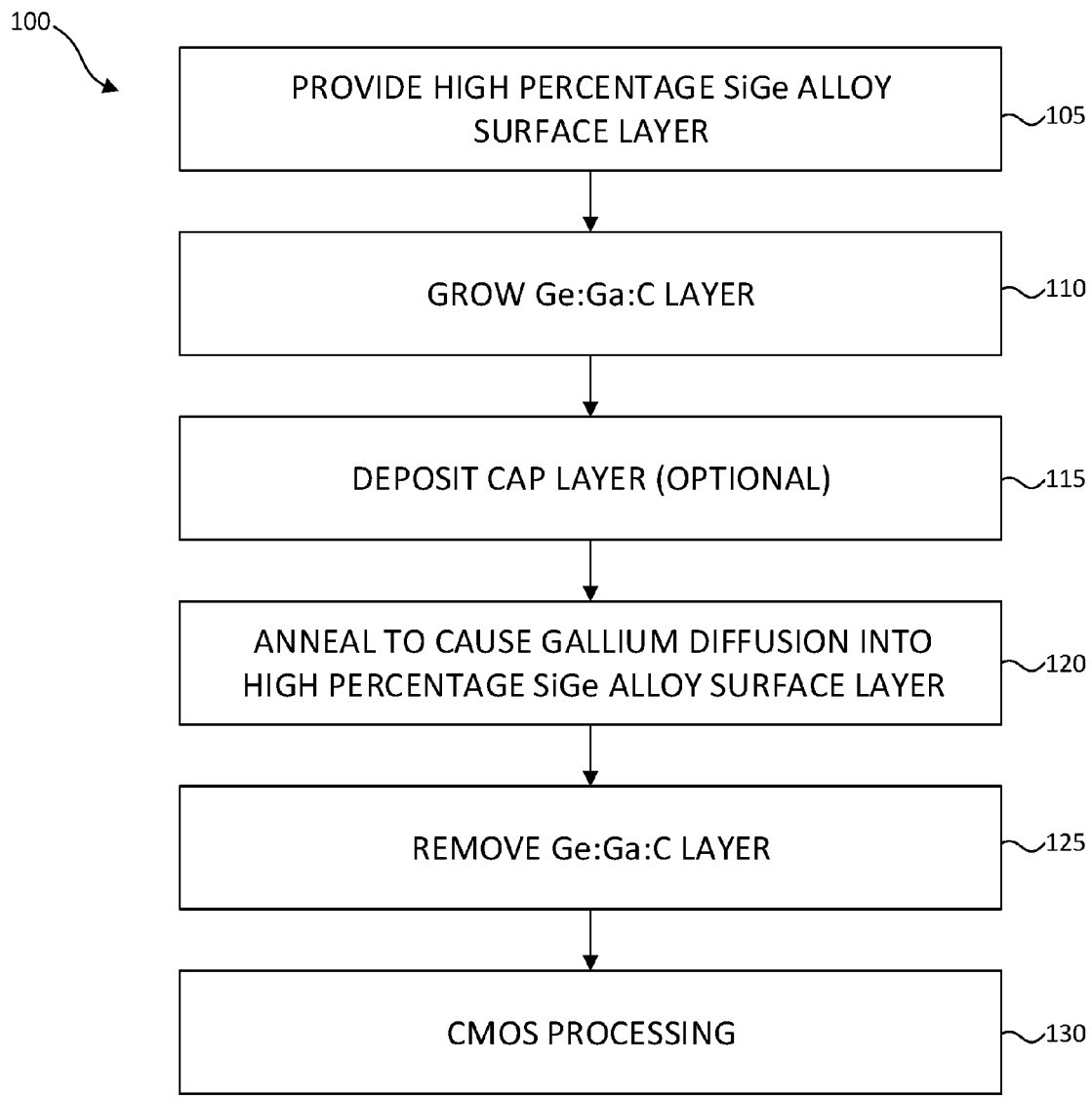
FIG. 1 shows an exemplary method for providing high gallium doping in a high percentage silicon germanium surface layer.

FIG. 1 shows a flow diagram of a method 100 for providing high acceptor level doping in high percentage silicon germanium alloys ($Si_{1-x}Ge_x$ where x is 0.85 or greater). Trimethyl gallium (TMGa) is an exemplary precursor used in organo-metallic vapor phase epitaxy (MOCVD) for the deposition of epitaxial gallium-containing layers. The exemplary method allows the use of such a carbon-containing organo-metallic precursor without carbon incorporation in the resulting structure, as described further below.

Although the method 100 and the structures formed thereby are entirely novel, many of the individual processing steps required to implement the method 100 may utilize conventional semiconductor fabrication techniques and conventional semiconductor fabrication tooling. These techniques and tooling will already be familiar to one having ordinary skill in the relevant arts given the teachings herein. Moreover, details of the individual processing steps used to fabricate semiconductor devices described herein may be found in a number of publications, for example, James D. Plummer et al., *Silicon VLSI Technology: Fundamentals, Practice, and Modeling* 1st Edition, Prentice Hall, 2001; S. Wolf and R. N. Tauber, *Silicon Processing for the VLSI Era, Volume* 1, Lattice Press, 1986; S. Wolf, *Silicon Processing for the VLSI Era, Vol. 4: Deep-Submicron Process Technology*, Lattice Press, 2003; and S. M. Sze, *VLSI Technology, Second Edition*, McGraw-Hill, 1988, all of which are incorporated by reference herein. It is also emphasized that the descriptions provided herein are not intended to encompass all of the processing steps that may be required to successfully form a functional device. Rather, certain processing steps that are conventionally used in forming integrated circuit devices, such as, for example, wet cleaning steps, are purposefully not described herein for economy of description. However, one skilled in the art will readily recognize those processing steps omitted from this more generalized description. Structural and functional aspects of MOSFETs and FinFETs are described in J. G. Fossum et al., *Fundamentals of Ultra-Thin-Body MOSFETs and FinFETs*, Cambridge University Press, 2013, which is also hereby incorporated by reference herein.

Before the method 100 is started, a semiconductor structure is obtained that includes one or more surfaces on which a high percentage silicon germanium alloy surface layer can be formed. The semiconductor structure may include a bulk silicon substrate and/or other film layers deposited thereon. One or more regions of the semiconductor structure can be electrically isolated. A patterned mask may be formed on the structure prior to and/or following formation of the surface layer.

The method starts in step 105 with the formation of a high percentage silicon germanium alloy surface layer 20. Such a layer is schematically illustrated in FIG. 2 and has the composition $Si_{1-x}Ge_x$ where x is 0.85 or greater. The value of x should not exceed 0.95 to ensure the temperature at which the alloy surface layer melts is higher than the melting point of pure germanium. The surface layer 20 is a blanket layer formed on a horizontal semiconductor surface in some embodiments, but can be formed on any surface of the underlying semiconductor structure, including vertical surfaces. The surface layer 20 can be a graded layer, the top region of which has the composition $Si_{1-x}Ge_x$ where x is 0.85 or greater while the bottom region has a lesser germanium concentration depending on the intended function of the structure to be provided and the composition of the underlying semiconductor layer. In some embodiments, the layer 20 comprises fins. Alternatively, the surface comprises an embedded region in a bulk wafer or an aspect ratio trapping trench bottom in a semiconductor substrate. The surface layer 20 may include regions intended for subsequent use as junction regions or source/drain regions of field-effect transistors once doped, the areas between the intended source/drain regions being protected by a mask or dummy gate for later use as channel regions. Exemplary epitaxial growth processes that are suitable for use in forming silicon germanium epitaxy include rapid thermal chemical vapor deposition (RTCVD), low-energy plasma deposition (LEPD), ultra-high vacuum chemical vapor deposition (UHVCVD), atmospheric pressure chemical vapor deposition (APCVD) molecular beam epitaxy (MBE), and metal organic CVD (MOCVD). The temperature for epitaxial deposition processes typically ranges from 350° C. to 850° C.

In step 110, a sacrificial Ge:Ga:C layer 22 is grown on the surface layer, as schematically illustrated in FIG. 3. The sacrificial germanium layer 22 is either epitaxially grown or is polycrystalline. The term "epitaxial" as used in the present application denotes the growth of a semiconductor material on a deposition surface of a semiconductor material, in which the semiconductor material being grown has the same crystalline characteristics as the semiconductor material of the underlying deposition surface. In an epitaxial deposition process, the chemical reactants provided by the source gases are controlled and the system parameters are set so that the depositing atoms arrive at the deposition surface of a semiconductor material with sufficient energy to move around on the surface and orient themselves to the crystal arrangement of the atoms of the deposition surface. Therefore, an epitaxial semiconductor material that is formed by an epitaxial deposition process has the same crystalline characteristics as the deposition surface on which it is formed. Exemplary precursors for forming the gallium-doped germanium layer 22 using a metal-organic chemical vapor deposition (MOCVD) process include germane ($GeH_4$), digermane ($Ge_2H_6$), and TMGa (trimethylgallium). Carbon is an unwanted byproduct of the metal organic gallium source. MOCVD process parameters using such precursors are known to the art. The thickness of the gallium-doped germanium layer is fifty to one thousand nanometers (50-1,000 nm) in some embodiments of the method. The gallium doping level is the range of $5 \times 10^{20}$ $cm^{-3}$-$5 \times 10^{21}$ $cm^{-3}$. Use of a metal-organic precursor such as TMGa during MOCVD causes unwanted carbon to be inadvertently incorporated within the gallium-doped germanium layer 22.

Step 115 of the method 100 involves the optional deposition of a cap layer on the gallium-doped germanium layer 22. A silicon nitride ($Si_3N_4$) cap layer (not shown) is deposited via CVD, PECVD, sputtering, or other suitable technique on the Ge:Ga:C layer 22 in some embodiments. The capped or uncapped structure is then annealed to drive the gallium within the gallium-doped germanium layer 22 into the silicon germanium alloy layer 20, forming a SiGe:Ga region 24. The carbon present within the Ge:Ga:C layer 22 does not diffuse into the silicon germanium alloy layer 20 during such annealing. The SiGe:Ga region 24 is accordingly essentially carbon-free and is effective for source/drain applications or junction formation in CMOS devices. The SiGe:Ga region 24 includes a gallium gradient (diffusion profile) with a higher gallium doping level near the top surface thereof than further within the region. In an exemplary source/drain region, the gallium concentration may be $2$-$6 \times 10^{20}$ $cm^{-3}$ near the surface of the silicon germanium alloy layer 20, allowing very low resistance contact formation. The doped region 24 extends, for example, between ten and thirty nanometers within the silicon germanium alloy layer 20. The doping level of the SiGe alloy layer 20 depends in part on the relative thicknesses of the Ge:Ga:C layer 22 and the SiGe alloy layer 20. The gallium doping concentration decreases from the surface, the in-depth distribution of the dopant being influenced by the temperature and diffusion time. The doped, carbon-free surface region 24 of the SiGe alloy layer obtained preferably includes a gallium concentration of at least $2 \times 10^{20}$ $cm^{-3}$ to provide a level of electrical conductivity that enables superior performance in source/drain and other applications within integrated circuits.

Any suitable annealing process that provides the targeted gallium doping concentration within the surface region 24 of the SiGe alloy layer 20 can be employed. Rapid thermal annealing (RTA) and laser annealing can, for example, be employed. In an exemplary embodiment, the wafer substrate (not shown) which supports the SiGe alloy layer 20 is held at 900° C. and laser annealing is employed to melt the Ge:Ga:C layer 22. While the duration of laser annealing is short, typically in the millisecond or milliseconds range, the germanium layer 22 stays molten for a longer period of time. The underlying substrate is also annealed, but does not melt, allowing a sufficient amount of gallium diffusion to take place. Heating the wafer from the backside will slow down the crystallization of the Ge:Ga:C layer 22, enhancing the doping level, since cool down is prolonged. A heated chuck is employed in some embodiments to maintain the substrate temperature. The SiGe alloy layer 20, having a higher melting point than the Ge:Ga:C layer 22 due to its lower germanium content, remains in a solid state. The laser anneal raises the temperature of the doped germanium layer to 1,000-1,200° C., which is above the melting point of germanium. The substrate temperature is maintained at or above 850° C., for example at 900° C., which is near the melting point of germanium, for about a minute while the doped germanium layer 22 slowly recrystallizes. A structure as shown in FIG. 4 is accordingly obtained.

The doped germanium layer 22 is selectively removed from the structure in step 125 following completion of annealing and gallium diffusion into the SiGe alloy layer 20 in step 120. As known in the art, germanium can be removed using hot water or a hydrogen peroxide solution, neither of which will have an effect on the underlying SiGe alloy layer 20 or the gallium-doped surface region 24 thereof. A structure 30 as schematically illustrated in FIG. 5 is accordingly obtained. The exemplary structure includes a p-doped surface region 24 extending ten to thirty nanometers within the SiGe alloy layer 20 while the remainder of the layer 20 is essentially undoped. It will be appreciated that, depending on the thicknesses of the SiGe alloy layer 20 and the doped germanium layer 22 formed thereon, the doped surface region 24 may comprise a lower or higher proportion of the SiGe alloy layer 20 upon completion of the process than that shown. In some embodiments, the entire SiGe alloy layer 20 may include gallium doping. The gallium-doped silicon germanium region 24 within the silicon germanium alloy surface layer has a dopant profile comprising a diffusion profile and includes no dopant-induced end-of-range (EOR) defects such as those that arise using ion implantation techniques. As known in the art, diffusion profiles and implantation profiles of dopants introduced within semiconductor materials have different characteristics. Diffusion is characterized by an isotropic dopant profile. In diffusion, dopant atoms move from a surface into a semiconductor substrate by means of a concentration gradient. Ions are spread through random motion from higher concentration regions to regions of lower concentration. Ion implantation results in a generally Gaussian distribution within the semiconductor substrate wherein the peak concentration lies at a depth below the substrate surface.

Thus, the method 100 is operative to effectively provide high acceptor level (p+) doping in a high percentage silicon germanium alloy without compromising device performance by incorporating carbon. The process provides p-doped regions having no dopant-induced crystal (EOR) defects that characterize implantation processes. Junction regions of a field-effect transistor (FET) (for example source/drain extensions) are comprised by the essentially carbon-free gallium-doped region 24 in some embodiments. In other embodiments, source/drain regions of a FET comprise the gallium-doped region 24.

Figure 6:
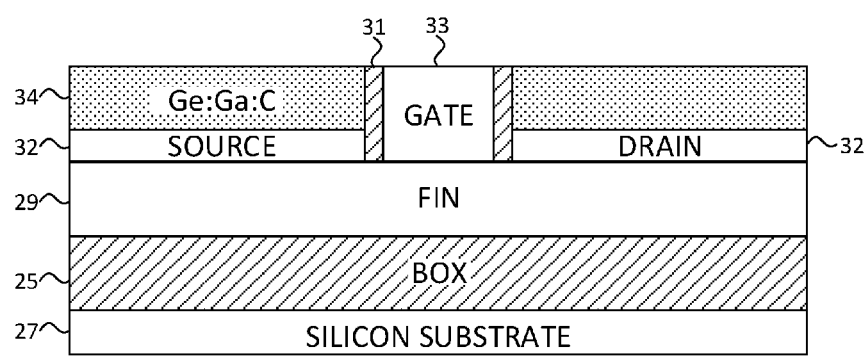
FIG. 6 is a schematic, cross-sectional view showing a gallium-doped germanium layer formed on source/drain regions of a finned structure.

FIG. 6 illustrates one exemplary application of the method 100 during fabrication of a p-type FinFET device. The exemplary finned structure shown in FIG. 6 is formed using a semiconductor-on-insulator substrate that includes a crystalline semiconductor layer, which can be referred to as an SOI layer, from which an array of semiconductor fins 29 is formed. The fin heights are commensurate with the thickness of the SOI layer of the original substrate from which they are formed. Fin pitch is 25-50 nm in some embodiments. The substrate layer 27 is essentially undoped in one or more embodiments. The SOI layer and resulting fins 22 in the exemplary structure are substantially monocrystalline. An electrically insulating layer 25 such as a buried oxide (BOX) layer is provided between the substrate layer 27 and the SOI layer. Silicon dioxide is among the materials that may be employed to form the electrically insulating layer 25. Other buried insulators such as boron nitride (BN) and aluminum oxide ($Al_2O_3$) may alternatively be employed to form the BOX layer in some embodiments. Depending on the heights of the fins 29 to be formed, in some embodiments the thickness of the crystalline semiconductor layer (SOI layer) is in the range of 10 nm to 60 nm. Various methods of fabricating semiconductor-on-insulator (SOI) substrates as employed in one or more embodiments are known, one of which is the SMART CUT® method and wafer bonding, wherein two semiconductor substrates with silicon oxide surface layers are bonded together at the silicon oxide surfaces to form a BOX layer between the two semiconductor substrates. Methods of forming semiconductor fins 29 using photolithography or sidewall image transfer (SIT) are familiar to those of skill in the art. SIT facilitates the fabrication of fins that are smaller in spacing than photolithographic techniques permit.

Dielectric and polysilicon layers may be deposited on the finned substrate and patterned to form dummy gates 33 in accordance with standard polysilicon gate CMOS process flows. The dummy gates 33 extend across a plurality of the parallel semiconductor fins 29 and have substantially the same dimensions in one or more embodiments. Any gate pitch suitable for the intended application of the completed product may be chosen. Gate sidewall structures or spacers 31 are formed on the dummy gates 33. A silicon nitride ($Si_3N_4$) layer can be deposited via CVD, PECVD, sputtering, or other suitable technique, forming the spacers 31. The spacers can include a single layer or be multi-layer. Spacer thickness is between two and ten nanometers (2-10 nm) in some embodiments. Spacers can be formed by any method known in the art, including depositing a conformal nitride layer over the dummy gate structures and removing unwanted material using an anisotropic etching process such as reactive ion etching or plasma etching. The dummy gates 33 and associated spacers 31 protect the underlying portions of the semiconductor fins 29 that later function as channel regions of FinFET devices.

The fins 29 may be subjected to ion implantation following formation of the gate sidewall spacers 31 to form extension junctions. If the fins 29 have a high germanium content, such extension junctions can be formed using the disclosed method 100. Expanded regions 32 can be grown epitaxially on the exposed portions of the semiconductor fins 29 adjoining the dummy gate and spacers. In the exemplary embodiment, undoped high germanium-percentage silicon germanium is grown epitaxially on the sidewalls (110 surfaces) of the fins to increase the volumes of the regions 32. A Ge:Ga:C layer 34 is then formed on the expanded regions 32. Annealing the resulting structure as described above with respect to step 120 will cause diffusion of gallium into the expanded regions. The doped, expanded regions 32 are functional as source/drain regions of the resulting structure. The Ge:Ga:C layer 34 is removed from the structure in accordance with step 125. The method 100 is applicable to planar devices as well as three-dimensional devices. It is further applicable to devices formed using bulk semiconductor substrates as well as SOI substrates.

Step 130 includes further CMOS processing that follows completion of steps 105-125. Once the (front-end-of-line/FEOL) layer that contains field-effect transistors (FETs), memory devices, or other structures incorporating the gallium-doped region(s) 24 (or 32) has been completed, middle-of-line (MOL) processing including steps typically used for fabricating metal contacts for logic circuitry components such as field-effect transistors (FETs), resistors, diodes, and capacitors is conducted. Interlayer dielectric (ILD) is used to electrically separate closely spaced interconnect lines. Back-end-of-line (BEOL) processing involves the creation of metal interconnecting wires that connect the devices formed in FEOL processing to form electrical circuits. The wires are electrically isolated by dielectric layers.

Given the discussion thus far and with reference to the exemplary embodiments discussed above and the drawings, it will be appreciated that, in general terms, an exemplary fabrication method is provided for the gallium doping of a silicon germanium layer. The method includes obtaining a substrate including a silicon germanium alloy surface layer 20 (or 32) having the composition $Si_{1-x}Ge_x$ where x is 0.85 or greater and forming a gallium-doped germanium layer 22 (or 34) on the silicon germanium alloy surface layer. The germanium layer has a higher germanium content and therefore a lower melting point than the silicon germanium alloy surface layer. The method further includes causing diffusion of gallium from the germanium layer into the silicon germanium alloy surface layer, thereby forming a gallium-doped silicon germanium region 24 within the silicon germanium alloy surface layer. The germanium layer 22 is then removed, resulting in a silicon germanium structure 30 as schematically illustrated in FIG. 5 having a gallium doped surface region 24 having a diffusion profile. The exemplary method allows forming the germanium layer on the silicon germanium alloy surface layer by epitaxially growing the germanium layer using a germanium-containing precursor such as germane and a stable metal-organic precursor containing gallium and carbon, such as trimethylgallium, without incorporating carbon within the gallium-doped region 24 formed in the silicon germanium layer 20. The step of causing diffusion of gallium from the germanium layer 22 into the silicon germanium alloy surface layer 20 includes melting the germanium layer 22 while the silicon germanium alloy surface layer is annealed but maintained in a solid state.

A semiconductor structure is provided which includes a substrate including a silicon germanium alloy surface layer 20 having the composition $Si_{1-x}Ge_x$ where x is 0.85 or greater. A gallium-doped silicon germanium region 24 is within the silicon germanium alloy surface layer, the gallium-doped silicon germanium region having a dopant profile comprising a diffusion profile and including no dopant-induced end-of-range (EOR) crystal defects. the gallium-doped silicon germanium region has a gallium concentration of at least $2 \times 10^{20}$ cm$^{-3}$ in one or more embodiments. A surface region having such a doping concentration has sufficient electrical conductivity for a number of applications within integrated circuits, including but not limited to source/drain applications. The semiconductor structure is a FinFET structure (such as shown in FIG. 6) in some embodiments including gallium-doped epitaxial structures 32 that comprise source/drain regions.

The methods described above are used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input devices, and a central processor. These integrated circuits and end products would also fall within the scope of the disclosed subject matter.

All the features disclosed herein may be replaced by alternative features serving the same, equivalent, or similar purposes, unless expressly stated otherwise. Thus, unless expressly stated otherwise, each feature disclosed is one example only of a generic series of equivalent or similar features. The terminology used herein is for the purpose of describing particular embodiments only and is not intended to be limiting. As used herein, the singular forms "a," "an" and "the" are intended to include the plural forms as well, unless the context clearly indicates otherwise. It will be further understood that the terms "comprises" and/or "comprising," when used in this specification, specify the presence of stated features, steps, operations, elements, and/or components, but do not preclude the presence or addition of one or more other features, steps, operations, elements, components, and/or groups thereof. Terms such as "above" and "below" are used to indicate relative positioning of elements or structures to each other as opposed to relative elevation. It should also be noted that, in some alternative implementations, the steps of the exemplary methods may occur out of the order noted in the figures. For example, two steps shown in succession may, in fact, be executed substantially concurrently, or certain steps may sometimes be executed in the reverse order, depending upon the functionality involved.

It is to be appreciated that the various layers and/or regions shown in the accompanying figures may not be drawn to scale. Furthermore, one or more semiconductor layers of a type commonly used in such integrated circuit devices or other layers may not be explicitly shown in a given figure for ease of explanation. This does not imply that the semiconductor layer(s) or other layer(s) not explicitly shown are omitted in the actual integrated circuit device.

Any element in a claim that does not explicitly state "means for" performing a specified function or "step for" performing a specified function is not to be interpreted as a "means for" or "step for" clause as specified in AIA 35 U.S.C. §112(f). In particular, the use of "steps of" in the claims herein is not intended to invoke the provisions of AIA 35 U.S.C. §112(f).

What is claimed is:

1. A method for providing gallium doping in a silicon germanium layer, comprising:
    obtaining a substrate including a silicon germanium alloy surface layer having the composition $Si_{1-x}Ge_x$ where x is 0.85 or greater;
    forming a gallium-doped germanium layer on the silicon germanium alloy surface layer, the germanium layer having a higher germanium content and a lower melting point than the silicon germanium alloy surface layer;
    causing diffusion of gallium from the germanium layer into the silicon germanium alloy surface layer, thereby forming a gallium-doped silicon germanium region within the silicon germanium alloy surface layer, and
    removing the germanium layer from the silicon germanium alloy surface layer.

2. The method of claim 1, wherein forming the germanium layer on the silicon germanium alloy surface layer includes epitaxially growing the germanium layer using a germanium-containing precursor and a metal-organic precursor comprising gallium.

3. The method of claim 2, wherein the metal-organic precursor comprises trimethylgallium.

4. The method of claim 2, wherein causing diffusion of gallium from the germanium layer into the silicon germanium alloy surface layer includes melting the germanium layer while the silicon germanium alloy surface layer is maintained in a solid state.

5. The method of claim 4, wherein the germanium layer further comprises carbon, further wherein causing diffusion of gallium from the germanium layer into the silicon germanium alloy surface layer causes essentially no diffusion of the carbon into the silicon germanium alloy surface layer.

6. The method of claim 5, wherein causing diffusion of gallium from the germanium layer into the silicon germanium alloy surface layer further includes maintaining the substrate at a temperature of at least eight hundred fifty degrees Centigrade but below the melting point of the germanium layer while the germanium layer is in a molten state.

7. The method of claim 6, wherein the silicon germanium alloy surface layer comprises parallel fins.

8. The method of claim 6, wherein the gallium-doped silicon germanium region has a gallium concentration of at least $2 \times 10^{20}$ cm$^{-3}$.

9. The method of claim 2, wherein the gallium-doped silicon germanium region has a gallium concentration of at least $2 \times 10^{20}$ cm$^{-3}$.

10. The method of claim 2, wherein the metal-organic precursor comprises carbon, further wherein causing diffusion of gallium from the germanium layer into the silicon germanium alloy surface layer causes essentially no diffusion of the carbon into the silicon germanium alloy surface layer.

11. The method of claim 10, wherein the gallium-doped silicon germanium region comprises a source/drain structure of a field-effect transistor.

12. The method of claim 11, further including forming the germanium layer on epitaxial regions grown on sidewalls of semiconductor fins.

* * * * *